United States Patent [19]

Lin et al.

[11] Patent Number: 4,897,602

[45] Date of Patent: Jan. 30, 1990

[54] ELECTRONIC DEVICE PACKAGE WITH PERIPHERAL CARRIER STRUCTURE OF LOW-COST PLASTIC

[75] Inventors: Paul T. Lin; Michael B. McShane; Charles G. Bigler, all of Austin; John A. Goertz, Red Rock; Joan M. Hamilton, Austin, all of Tex.

[73] Assignee: Motorola, Inc., Schaumburg, Ill.

[21] Appl. No.: 258,235

[22] Filed: Oct. 14, 1988

Related U.S. Application Data

[63] Continuation-in-part of Ser. No. 141,013, Jan. 4, 1988.

[51] Int. Cl.$^4$ .............................................. G01R 1/04
[52] U.S. Cl. .................................. 324/158 F; 361/421
[58] Field of Search ....................... 324/158 F, 73 PC; 439/68–73; 206/328, 331; 361/214, 215, 421

[56] References Cited

U.S. PATENT DOCUMENTS

3,267,335  8/1966  Walkow ................................ 439/68
4,711,700  12/1987  Cusack ................................. 439/72

Primary Examiner—Ernest F. Karlsen
Assistant Examiner—Edward Urban
Attorney, Agent, or Firm—John A. Fisher

[57] ABSTRACT

An electronic device package on a lead frame with a peripheral carrier structure holding the distal ends of the leads in rigid position. The carrier structure is spaced apart from the package body and permits the package to be handled and tested while protecting the leads. A different, relatively lower quality and less expensive material is used for the carrier structure than for the package body to reduce the cost of the package since the carrier structure may comprise several times, for example four times or more, the volume of the package body.

16 Claims, 6 Drawing Sheets

ELECTRONIC DEVICE PACKAGE WITH PERIPHERAL CARRIER STRUCTURE OF LOW-COST PLASTIC

This application is a continuation in part of commonly assigned application Ser. No. 141,013 filed Jan. 4, 1988.

FIELD OF THE INVENTION

The invention relates to packages and structures to hold electronic components, and more particularly relates to plastic encapsulated electronic packages.

BACKGROUND OF THE INVENTION

Many types of packages are known for electronic components, particularly integrated circuits. Typically, integrated circuits are packaged in structures that consist of the integrated circuit chip bonded to leads, where the chip and the inner portions of the leads are surrounded or encapsulated by a material forming the package body from which the outer ends of the leads protrude. The exposed leads permit the packaged component to be mounted to a printed circuit (PC) board, or in a fixture or socket, or other connecting system.

Conventionally, the material of the package body is made from preformed parts, such as ceramic and occasionally metal, which are then hermetically bonded around the chip, or the material is a plastic and is cast around the chip and the inner portion of the leads in a plastic injection and transfer molding operation. The plastic package is usually not hermetic. Some research is also being conducted in premolding plastic body parts which are then adhesively secured around the integrated circuit in a fashion similar to that of ceramic packages. While ceramic packages are of a higher quality than plastic packages, and more secure from invasion by outside elements such as moisture, they are also more expensive than the plastic packages.

Another issue in packaging electronic components such as integrated circuits, is the material of the leads. Traditionally, lead frames for packages are relatively thick, of about 5 to 10 mils, and the electrical connection from the bonding pads of the integrated circuit to the inner ends of the lead frame are made by very thin wire bonds. In recent years, considerable interest has been generated by using thin foil lead frames or tape, often backed by a layer of polyimide or other plastic. Sometimes the tape has three layers. The advantage of a tape lead frame is that the lead frames can take the form of windows on strips, much like the frames on photographic film, and the bonding process can be automated at high speed to provide a tape automated bonding (TAB) process. The thin tape lead frames typically have a thickness of 1 to 3 mils which permits the package to be made smaller.

Electronic packages using the above described technologies take many forms. One popular form is the dual in-line package or DIP which consists of an elongated package body with leads extending from and turning down on both sides of the package body. Another form is the plastic leaded chip carrier (PLCC) which involves a flat, rectangular or square package body with leads extending from and turning down along all of the four sides of the package body. The ends of the leads may also be configured differently, such as elongated with standoff shoulders for through-hold mounting, or J-lead, gull wing or butt joint for surface mounting.

It is well known that there is constant pressure to provide integrated circuits with higher complexity in smaller packages. This causes the development of DIPs and PLCCs and other packages with very high pin or lead counts where the package itself is very small. Such packages have leads that tend to be fragile and difficult to handle. Often the leads of the package are easily bent. It will be appreciated that TAB technology is employed to solve some of the size requirements, but the thinner leads are even more fragile than leads made using conventional lead frames.

Another requirement of integrated circuit packages is that they must be tested before they are sold to a customer. The handling involved in moving and testing the packages provides additional opportunity for the leads to be damaged. Further, test equipment, particularly test sites, must be devised for each type of package that contains a different number of leads or leads on a different spacing or pitch. Another problem is that a package with leads spaced on a mil system cannot be tested on a tester with metric spaced contacts.

One solution to some of these problems for encapsulated plastic ICs employs a carrier frame. First, a semiconductor die is connected in a die-attach aperture of a copper foil tape. Die contact pads are bonded to the inner ends of interconnected finger contacts on the tape. The finger contacts etched in the foil include splayed out portions extending to probe ends. There are interconnect cross-links that initially connect the finger contacts and the tape edges and function as dam bars in subsequent encapsulation. The die and die bonds are mold encapsulated to form the die package, but also a carrier frame is simultaneously molded around and spaced from the periphery of the die package. The probe ends are exposed within a slot in the frame or extend from the ends of the frame so that probe tips can be pressed thereon to test the die and its bonds. Prior to testing, the interconnects exposed in the annulus between the package and the carrier are blanked out so that each finger leading from a die contact pad becomes discrete, that is, is no longer interconnected to an adjoining finger, so that testing of each die contact and bond can be done. The stiff, molded carrier frame acts to support the probe ends of the fingers and protects and stiffens the foil tape for the testing operations and for shipping and handling purposes. When the package is ready to be mounted, the carrier frame and probe ends are sheared away and discarded and the remaining portions of the fingers are formed into leads to be interconnected to a system, such as on a PC board.

This solution only contemplates that the die package and the carrier frame be molded at the same time using the same encapsulant. Generally, only high quality, thermoset plastics are used in electronic packages. Thus, one problem with this proposed solution is that the volume of the carrier frame is several times, for example, four times, that of the die package, and considerable relatively high quality, expensive plastic is discarded when the carrier frame is sheared off.

An additional problem encountered with prior carrier frame structures is the difficulty in making reliable electrical contact to the probe ends of the leads. In one prior structure, for example, the probe ends are positioned on a shelf or ledge which is an integral part of the carrier frames. The molding of the frame to produce this structure, however, is prone to leaving plastic flash overlying the probe ends. The plastic flash prevents reliable electrical contact to the probe ends during testing. In another prior structure, the probe ends are cut off in close proximity to the carrier frame leaving short "stubs" of the lead ends extending straight out from the frames. The stub ends provide only a limited surface for making contact during test. Additionally, although the lead frame itself may be plated or clad to insure good electrical contact to the ultimate device lead, contact during test is made only to the severed end which is not plated. Acceptable contact to the severed end can be made when the end is freshly cut, but reliability of the contact deteriorates with aging, especially with the time and temperature that may be encountered during life or accelerated testing.

SUMMARY OF THE INVENTION

Accordingly, it is an object of the present invention to provide a package for electronic devices having a large plurality of fine leads or pins that permits safe handling of the package with little risk of damage to the leads.

It is another object of the present invention to provide a package for electronic devices that permits safe handling of the package which is economical.

Another object of the present invention is to provide an electronic device package that enables the device to be tested while in a protected state before the leads are finally formed.

A still further object of the invention is to provide an improved package for an electronic device that provides improved electrical contact during testing.

In carrying out these and other objects of the invention, there is provided, in one form, an electronic device package having a carrier structure. The package has a lead frame with a plurality of leads peripherally surrounding an electronic element bonding area. Each lead has a proximal end near the bonding area, a distal end away from the bonding area and an intermediate portion between the proximal end and the distal end. An electronic element is bonded to the proximal ends of leads in the lead frame. A package body is provided over the electronic element and at least a portion of the proximal ends of each of the leads, the package body being of a first material. A carrier structure is present over at least a portion of the distal ends of at least some of the leads; the carrier structure being of a second material different from the first material. At least a portion of the intermediate portions of the leads are exposed and not covered by either material. A portion of the extremity of the distal end extends beyond the carrier structure and is exposed for contact during electrical testing of the electronic device. In a more specific embodiment, the extremity is shaped to optimize the electrical contact and to immobilize the lead end.

DETAILED DESCRIPTION OF THE INVENTION

Figure 1:
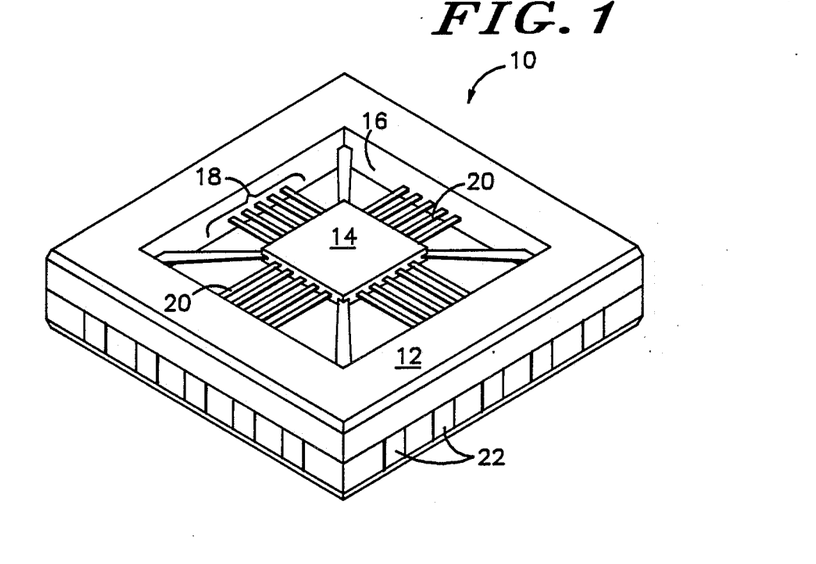
FIG. 1 is a three-quarters view of an electronic device package of this invention after assembly but before the carrier structure is excised.

Shown in FIG. 1 is one version of the electronic device package 10 of this invention after molding but before the excising of the carrier structure 12 that surrounds the package body 14. Note that carrier structure 12 is spaced apart from package body 14 by opening 16 which exposes leads 18, specifically the intermediate portions 20 thereof. Distal ends 22 of the leads 18 are seen around the perimeter of the carrier structure 12. It is apparent that package 10 can be handled by means of the carrier structure 12, minimizing contact with package body 14. The package 10 shown in FIG. 1 can be tested by means of the distal ends 22 of the leads or the intermediate portions 20. It is also apparent, however, that the volume of carrier ring 12 is considerably larger than that of the package body 14 and that appreciable material is wasted when carrier ring 12 is cut away and discarded. The exact amount of expensive plastic discarded depends on the dimensions of the ring.

One embodiment of the invention concerns providing carrier ring 12 of a different material than that of package body 14. For example, carrier structure 12 could be fabricated out of a relatively inexpensive thermoplastic or thermoset plastic, whereas the package body 14 is provided from a material necessary to withstand the rigors of use, for example, a high-quality engineering plastic. Such high quality materials are generally more expensive and may be low ionic, low alpha content materials or may be plastics that require special filler materials.

However, in another version, carrier ring 12 may be made from a higher quality material than package body 14. For example, the ring may be ceramic and the body plastic. The ceramic ring need only have one layer, such as a base or a cap that is sealed in place with glass, whereas the package body may be formed from premolded, high quality plastic. In another example, the carrier structure could be designed to be reusable, and thus made of a high quality material, whereas the package body could be a different, injection molded material.

As one example of how the materials can be different, consider that typically the plastic for the package body 14 has a dye or colorant added for cosmetic reasons or to make the package opaque to certain or most frequencies of radiation. A particularly common color is black. Most plastics without a colorant or pigment are clear or semi-transparent light yellow. However, there is no reason why a colorant need be used in carrier structure 12, and thus the cost of the plastic used therein can be reduced further.

The material for the carrier structure 12 may be optimized for other different properties than the material for the package body 14. For example, in one version, a plastic for use on the package body is optimized to relieve stress on the electronic device 32, whereas the carrier structure 12 may be optimized to minimize lead distortion using a plastic with little or no shrinkage to preserve the flatness of the lead frame 26.

Examples of a high-quality plastic suitable for use as a package body include NITTO 180 or HYSOL MG 36F or an electronic grade epoxy transfer mold compound. These are materials that are low alpha particle producers. Low viscosity plastics are also preferred.

Examples of relatively lower quality plastics that are more appropriate for the carrier ring material include the various forms of polyethylene, polypropylene, polystyrene, ABS resins, thermoplastic elastomers, phenolic injection molding compounds, among other materials.

The interior structure of the electronic device package 10 will be described in more detail with reference to FIG. 5. Electronic device package 24 shown therein has a lead frame 26 comprising a plurality of leads 18 peripherally surrounding an electronic element bonding area 28. This lead frame 26 may be of conventional, relatively thick metal or thinner tape or even a combination of the two. Each lead has a proximal end 30 near the bonding area 28, a distal end 22 away from the bonding area 28 and an intermediate portion 20 between the proximal end 30 and the distal end 22. It is apparent that leads 18 generally flare outward in direction and width from their proximal ends 30 to their distal ends 22. This flaring or splaying permits the spacing of the bonding pads on integrated circuit chip 32, the intermediate portions 20 (which eventually form the leads of the package) and the distal ends 22 to be of different sizes and of different pitches. For example, the spacing of distal ends 22, which may optionally include a peripheral testing pad 34, may be a standardized size and pitch, thereby permitting a variety of different kinds of packages with different numbers and pitches of leads to be tested by the same piece of equipment.

Leads 18 are typically held in relative position during assembly by interconnects or dam bars in places such as between the intermediate portions 20 of the leads 20, or between the peripheral testing pads 34, such as in a frame configuration around the entire frame 26. Polyimide tape may also be used to hold the leads in relative position. Such interconnections, which are not shown and are not a critical part of the invention, must be in a configuration where they can be sheared or cut away before testing of the device 32 to prevent shorting of the discrete leads 18.

The footprint 36 of the carrier structure 38 is shown superimposed on the lead frame 26 to indicate that peripheral testing pads 34 remain outside the carrier structure for testing purposes. Carrier structure 38 is composed of upper portion 40, or lower portion 42, or both, as premolded portions adhesively or thermally attached to the lead frame 26 at a different time or simultaneously with the providing of cap 44 and base 46 adhesively or thermally sealed to form the package body. Again, the quality and properties of the material and the seal of upper and lower portions 40 and 42 may be appreciably different or less expensive than the material of base 46 and cap 44. A die coat material may be applied inside the premolded cap 44 and base 46 of the package body. Base 46 and cap 44 of the package body may even be a ceramic material if the method for sealing the base 46 and cap 44 is purely adhesive or is achieved at a low temperature so as to not damage the carrier structure 38, or is performed at a customarily high temperature prior to the formation of carrier structure 38.

Heretofore the peripheral test pads 34 have been generally indicated without any specific details. FIGS. 6–11 illustrate, in cross section, alternate preferred embodiments of the test pads and illustrate the relationship of those pads to the carrier structure. These test pad configurations are useful regardless of the material from which the carrier structure is fabricated, and may be used in structures in which the package body and carrier structure are of the same or different material.

FIGS. 6–11 illustrate cross sections through the outer portion of carrier structure 80, that is, the portion of the carrier facing away from the package body. Structure 80 preferably has a top major surface 82 and a bottom major surface 84 terminating in a shaped outer periphery 86. The shaped outer periphery has a shape determined for ease of molding and for easy insertion into a test fixture. The shaped outer periphery is used as a form anvil for the shaping of the test pads.

Figure 6:
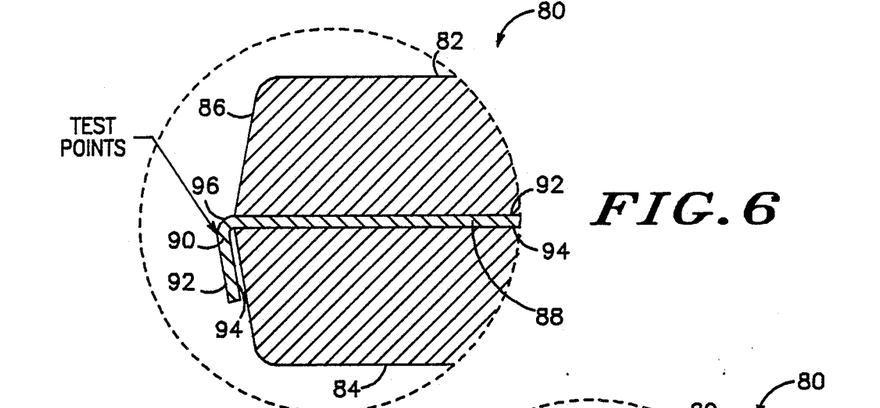
FIGS. 6–12 illustrate, in cross section, alternate embodiments of the peripheral test pads or probe areas.

In the embodiment illustrated in FIG. 6, the extreme distal ends of the generally planar leads 88 are positioned symmetrically with respect to the top and bottom major surfaces 82, 84 of carrier structure 80. The symmetrical placement of the leads avoids warping which can result from an asymmetric structure. Leads 88 extend through the carrier structure and the ends are bent at an angle to the plane of the leads using the outer periphery of the carrier structure as a form anvil. This shapes the lead ends to form a test pad 90. The test pads thus are tightly wrapped and substantially conform to the shaped periphery 86. In contrast, the formed leads of an IC device are usually free standing and separated from the package body by an air gap. This more complicated forming step used with the device leads, in contrast to the test pads on the carrier structure, is done to prevent microcracks in the package material which may deleteriously affect the long term reliability of the device. Although microcracks may occur in the carrier structure, these are of no consequence because they do not affect the integrity of the device package body.

Figure 12:
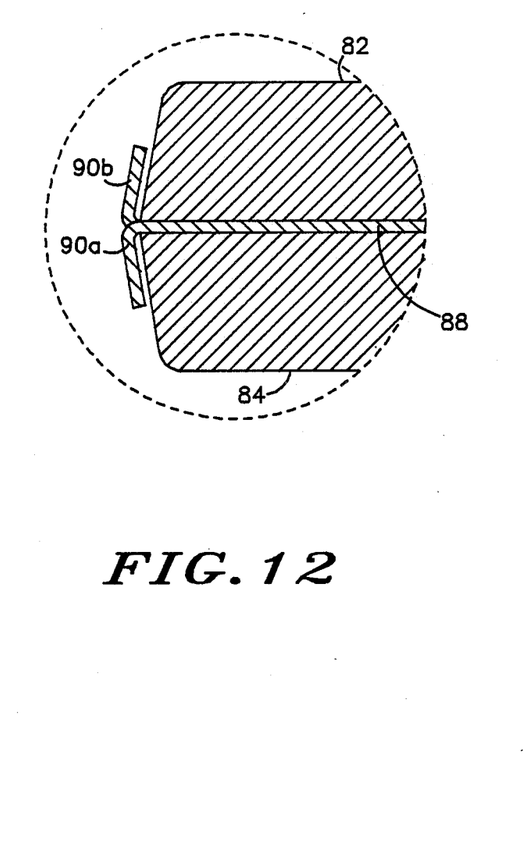

The test point 90 extends along the periphery a sufficient distance to provide a reliable test or probe surface to contact during testing. Alternatively, the leads can be bent toward either the top 82 or bottom 84 surface or, as illustrated in FIG. 12 the leads can be bent alternately toward the top and bottom surfaces such as leads 90b and 90a, respectively. This latter embodiment is useful, for example, with closely spaced leads, allows larger probe areas, and helps avoid inadvertent contact between leads or between test contacts.

The substantially planar lead 88 has upper 92 and lower 94 major surfaces. The lead is bent in a direction normal to the major surfaces to place lower surface 94 along and in alignment with the shaped outer periphery 86. This exposes the upper surface 92 and presents that surface for test contact. Contact can be made either along the broad major surface 92 or on the shoulder 96. Any plastic flash which inadvertently forms on surface 92 is removed by the step of bending the leads about the shaped outer surface.

Figure 7:
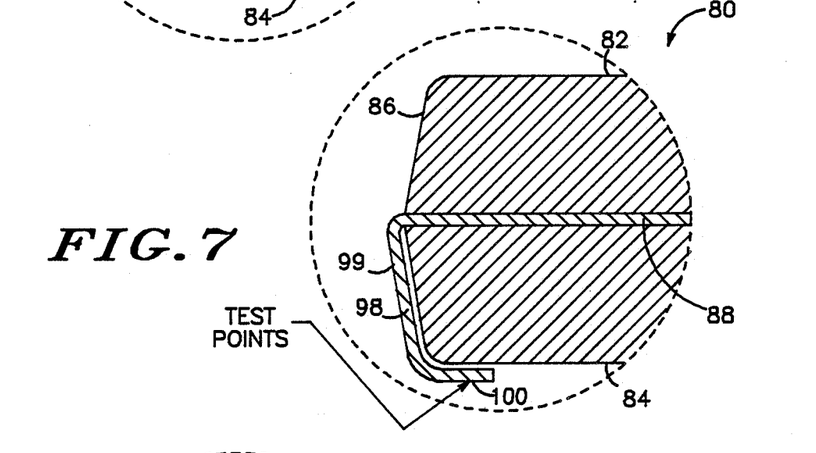

FIG. 7 illustrates a further embodiment of probe or test areas in accordance with the invention. In this embodiment, probe area 98 is extended along the periphery 86 and wraps around the bottom surface 84. Again, the probe area is formed using the carrier structure as a form anvil so that the probe area substantially conforms to the shape of the carrier structure. Contact to the probe area can be made, as above, to the broad major surface 99 or to the foot 100 at the bottom of the carrier structure. With this configuration the device can also be tested in the same manner as a surface mount device.

Figure 8:
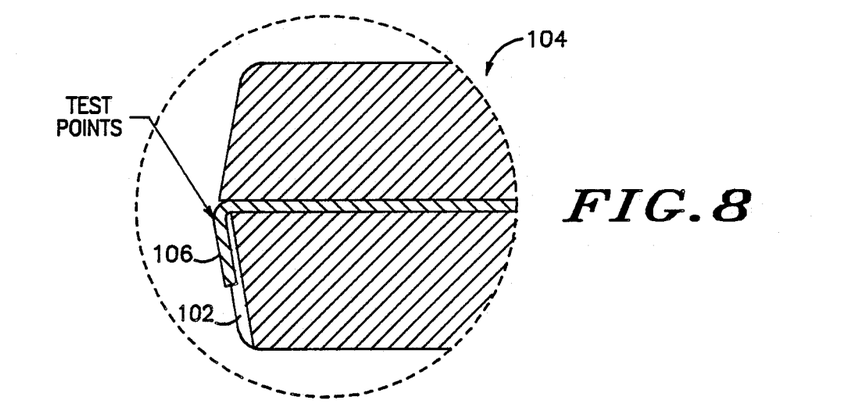
Figure 9:
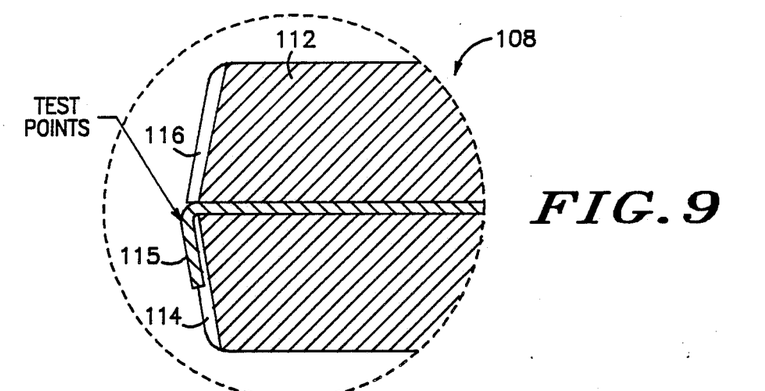

FIGS. 8 and 9 illustrate still further embodiments of the invention in which the outer periphery of the carrier structure is crenelated to provide captive slots for the probe areas. The embodiment illustrated in FIG. 8 includes a crenel 102 in the lower portion of carrier structure 104 into which probe area 106 is positioned. The crenelated surface of carrier 104 is used, as above, as a form anvil for the forming of probe areas 106.

FIG. 9 illustrates, in cross section another embodiment of the invention in which the outer surface of carrier structure 108 is crenelated. In this embodiment, both the bottom portion 110 and top portion 112 of carrier 108 are crenelated. Crenels 114 in bottom portion 110 provide captive slots for probe areas 115 and crenels 116 provide a guide for the probe or test contact of the tester which makes electrical contact to the probe area.

Figure 10:
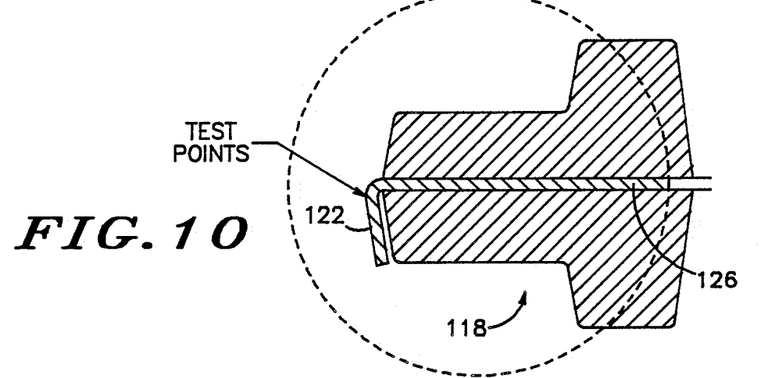
Figure 11:
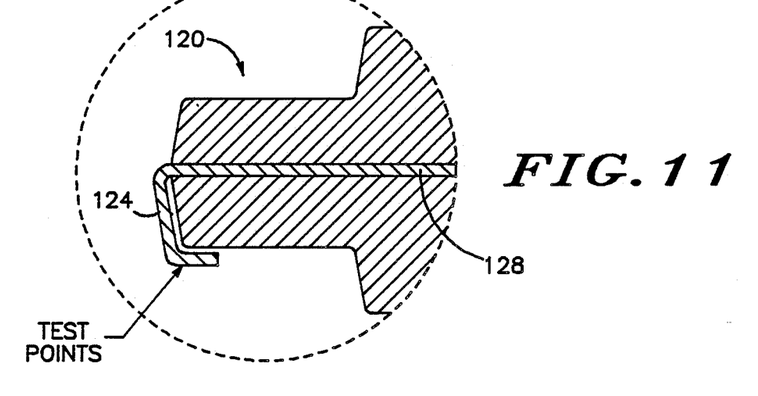

FIGS. 10 and 11 illustrate still further embodiments of the invention which reduce the amount of plastic required in the formation of the carrier structure. FIG. 10 illustrates a carrier structure 118 and FIG. 11 illustrates a carrier structure 120. In each of the illustrated structures, a probe area 122, 124, respectively is formed at the extremity of a substantially planar lead 126, 128 by bending that lead end about the shaped outer periphery of the carrier structure. The cross section of the carrier structure is shaped to provide the required strength and rigidity with a minimum amount of plastic. A similar carrier ring cross section can also be used, of course, with a crenelated carrier structure.

Figure 2:
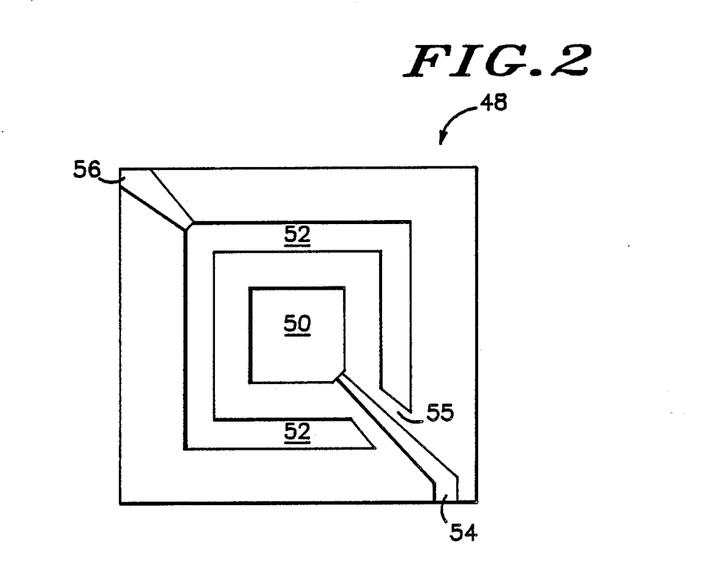
FIG. 2 is a simplified overhead view of a mold that may be used in one form of the present invention.

The electronic device package 10 of FIG. 1 may be achieved also by injection molding as is customarily used for the majority of plastic packages using a mold 48 such as shown in FIG. 2. Mold 48, carefully machined from metal, contains a mold cavity 50 for the package body and mold cavity 52 for the carrier structure. While it is possible to devise a mold that permits the carrier structure to have a closed ring configuration as seen in FIG. 1, such a mold would be considerably more expensive to fabricate than a mold 48 where the cavities 50 and 52 are coplanar. Cavities 50 and 52 must have gates to permit the mold material to enter the cavities 50 and 52 and it is difficult to machine a gate to an element inside a closed ring. However, cavity 52 may be cut to form an opening 55 at some point to permit the gate 54 of cavity 50 to access it. Separate gate 56 would supply a second, less expensive, thermoplastic or thermoset material to cavity 52.

Figure 3:
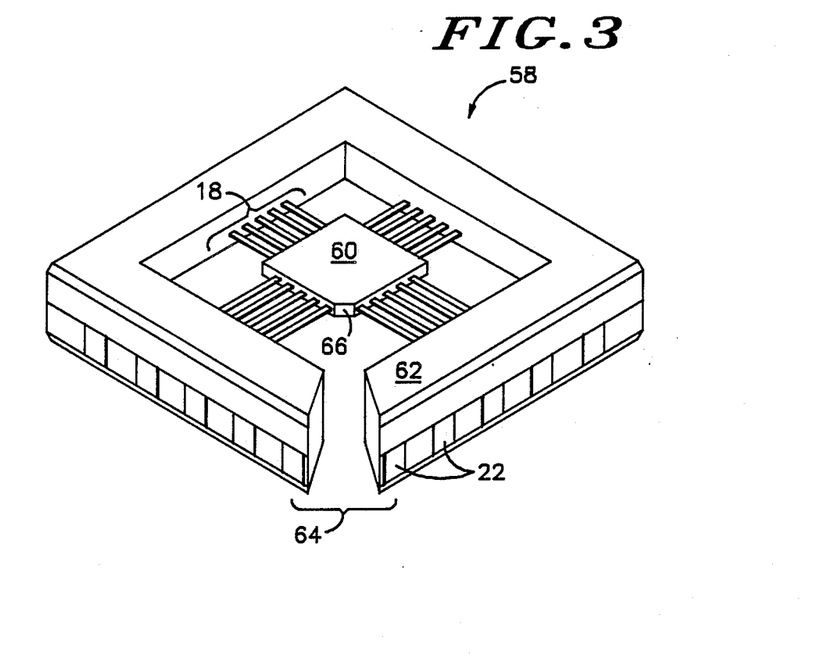
FIG. 3 is a three-quarters view of the electronic device package embodiment of this invention made using the mold of FIG. 2.

The package 58 that would be produced by mold 48 is shown in FIG. 3 and has a package body 60 surrounded by carrier structure 62. Carrier structure 62 has a gap 64 that was necessitated to permit gate 54 to deliver plastic to form package body 60. Of course, the leftover plastic in gates 54 and 56 is excised from package body 60 and carrier structure 62, respectively. The beveled surface 66 formed after the leftover plastic from gate 54 is removed may serve as a notch for registration, for example in an automated assembly line. Likewise, the gap 64 may serve to register the entire package 58, for example, as in an automated testing procedure.

While the carrier structure 62 may not be as rigid as the full ring structure 12 shown in package 10 of FIG. 1, it nevertheless provides sufficient strength and rigidity to prevent damage to and relative movement of leads 18.

It is also contemplated that in the case of encapsulating the die 32 and the leadframe 26 that the provision of the package body 60 and carrier structure 62 of split or ring-shape may be done in separate encapsulation steps, rather than simultaneously as described above. While this sequential procedure would be more expensive than performing both molding operations simultaneously, the savings in using a less expensive material for the carrier structure could be expected to compensate for the additional expense.

Figure 5:
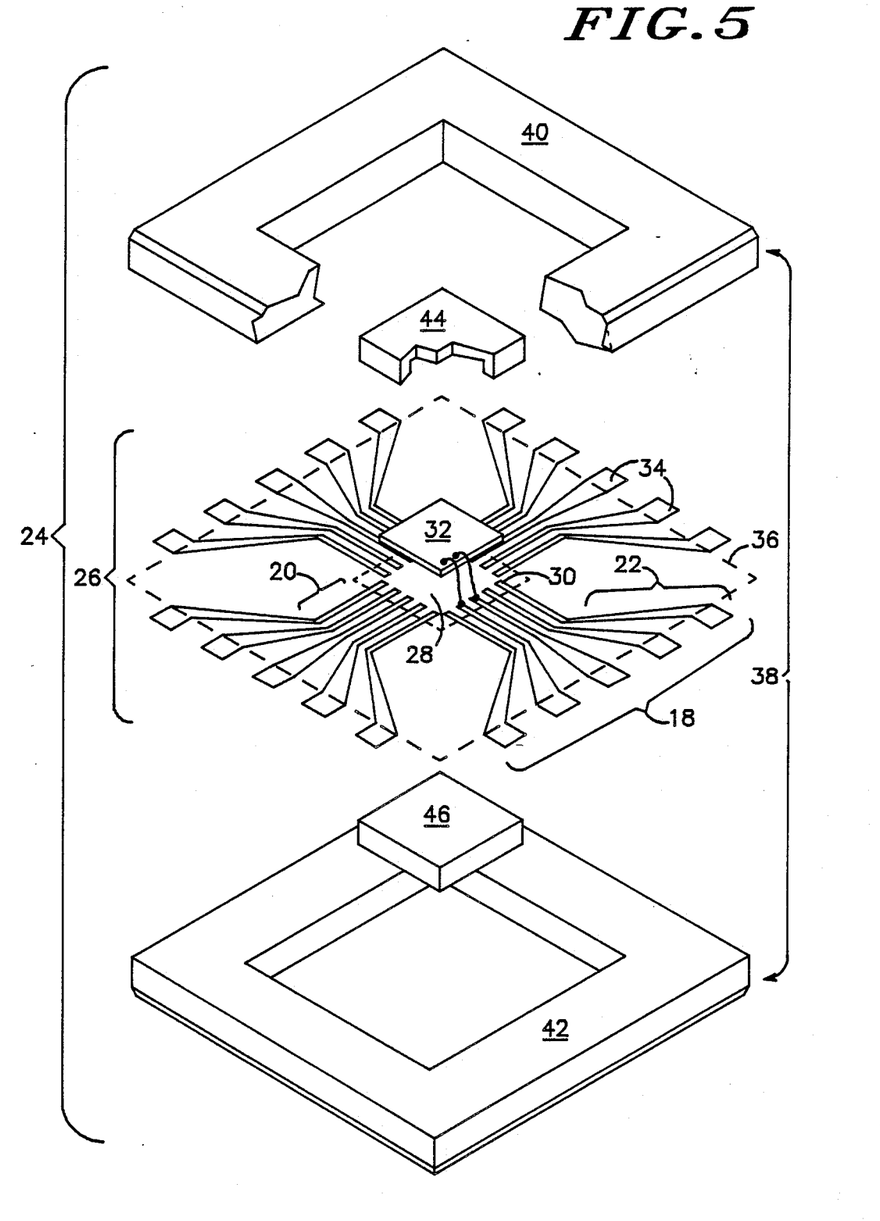
FIG. 5 is a three-quarters exploded view of another alternate version of the present invention.

In yet another form of the invention, the package 24 of FIG. 5 could be modified to require only the premolded upper portion 40 or only the premolded lower portion 42 as the carrier structure 38. Since the leads 18 are only temporarily housed by the carrier structure 38, there is no need for the distal ends 22 to be completely encapsulated. However, it will be appreciated that another form of the invention contemplates that the distal ends 22 of the leads 18 may be completely encapsulated. In such a case, the intermediate portions 20 would be the portions of the leads 18 contacted for test purposes.

Figure 4:
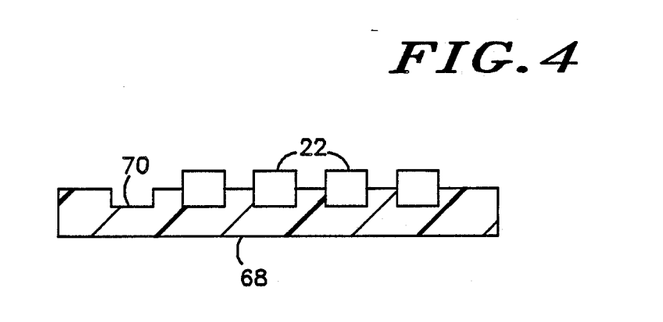
FIG. 4 is a section view of the distal ends of a lead frame mated with the carrier structure of an alternate version of the package of this invention.

In such an arrangement shown in FIG. 4, the carrier structure 68 may be provided with grooves or slots 70 to accommodate the distal ends 22 of leads 18. Distal ends 22 of the lead frame 26 would be adhesively or thermally attached to the carrier structure 68 as shown in cross section in FIG. 4. It is even contemplated that the tolerances of the width of the grooves 70 and the leads 18 could be designed in such a way as to permit leads 18 to be simply press-fitted into the slots 70. With suitable assembly and removal equipment, such carrier structures 68 could be removed and reused for a multiplicity of packages. The removal of the press-fit carrier structures 68 could be performed after the excising of the dam bars/interconnects between the leads 18 and testing and just prior to the formation of the leads close to the package body.

It will be appreciated that the use of a carrier structure in a ring or split ring shape is arbitrary. Due to the customary structure of leads in a lead frame configuration around an electronic element bonding area, it is convenient for the carrier structure to surround the package body. However, it will be appreciated that the carrier structure could appear as other shapes. For example, the carrier structure could take the form of a rectangular strip on each of the four sides of a quadrilateral package covering only the leads on that side of the package. Since some integrated circuit die, such as memory die, often have bonding pads only on two sides of the die, the rectangular strip form of carrier structure may be particularly suitable for these forms of electronic element.

It will also be understood that while a number of permutations of the inventive method have been described, that others are possible within the scope of the invention depending on the exact final structure desired or the assembly method chosen. For example, Table I illustrates a number of different configurations for the package body and carrier structure and whether the provision of the package body and carrier structure would likely be a simultaneous or sequential operation. In the case of sequential operations, the sequence may not matter, or may depend on the temperature cycles required. For example, if a ceramic package body and a thermoplastic carrier structure were to be used in conjunction, it is anticipated that the ceramic package body should be formed first and the thermoplastic carrier structure formed subsequently since the higher temperatures to seal some ceramic packages would damage the thermoplastic carrier structure that would typically have a lower melting point.

TABLE I

| Different Package Configurations | | |
|---|---|---|
| Package Body | Carrier Structure | Method |
| Molded | Molded | Simultaneous |

TABLE I-continued
Different Package Configurations

| Package Body | Carrier Structure | Method |
| --- | --- | --- |
| with Plastic Molded | with Plastic Premolded | or Sequential |
| with Plastic Premolded | with Plastic Molded | Sequential |
| with Plastic Premolded | with Plastic Premolded | Sequential Simultaneous or Sequential |
| Ceramic | Molded or Premolded with Plastic | Sequential |
| Plastic | Ceramic | Sequential |
| "Glob top" or bare die | Molded or Premolded Plastic | Simultaneous or Sequential |

We claim:

1. A packaged electronic device having a carrier structure comprising:
   a lead frame comprising a plurality of leads peripherally surrounding an electronic element bonding area, each lead having a proximal end near the bonding area, a distal end away from the bonding area and an intermediate portion between the proximal end and the distal end;
   an electronic element bonded to the proximal ends of leads in the lead frame;
   a package body over the electronic element and at least an end portion of the proximal ends of each of the leads, the package body being a first material; and
   a molded plastic carrier structure positioned to encapsulate at least a portion of the distal ends but not the extreme distal ends of a least some of the leads, the molded plastic carrier structure being of a second plastic material different from the first material;
   at least the intermediate portions of the leads being exposed and not covered by either material.

2. The electronic device package of claim 1 wherein the first material is of a first quality and the second material is of a second quality lower than said first quality.

3. The electronic device package of claim 1 wherein the first material is selected from the group consisting of plastic and ceramic and the second material is a plastic of a lower quality than the first material.

4. The electronic device package of claim 1 wherein the molded carrier structure at least partially encircles the package body.

5. The packaged electronic device of claim 1 further comprising a probe area comprising the extreme distal end of the leads, the probe area extending out from the molded carrier structure and formed to substantially conform to the shape of the outer surface of the molded carrier structure.

6. The packaged electronic device of claim 1 wherein the lead frame is substantially planar over a portion of its length and has first and second major surfaces and wherein the probe area comprises the extreme distal ends of the leads bent in a direction normal to the major surfaces to place the first of the surfaces in substantial alignment with the outer surface of the molded carrier structure and exposing the second surface for test.

7. The packaged electronic device of claim 1 wherein the molded carrier structure comprises a shaped outer periphery facing away from the package body and having a plurality of crenels in which the probe areas are captured.

8. A packaged electronic device having a carrier structure comprising:
   a lead frame comprising a plurality of leads peripherally surrounding an electronic element bonding area, each lead having a proximal end near the bonding area, a distal end away from the bonding area and an intermediate portion between the proximal end and the distal end;
   an electronic element bonded to the proximal ends of leads in the lead frame;
   a package body over the electronic element and the proximal ends of each of the leads, the package body being a first material of a first quality; and
   a molded carrier structure positioned to encapsulate at least a portion of the distal ends but not the extreme distal ends of at least some of the leads, the carrier structure being of a second material of a second quality different from the first material wherein the second quality is lower than said first quality, the carrier structure additionally at least partially encircling the package body;
   the intermediate portions of the leads being exposed and not covered by either material.

9. A packaged electronic device having a carrier structure comprising:
   a lead frame including a plurality of leads peripherally surrounding an electronic element bonding area, each lead having a proximal end near the bonding area, and a distal end away from the bonding area, the leads lying in a plane over a substantial fraction of their length;
   an electronic element bonded to the proximal ends of leads in the lead frame;
   a package body enclosing the electronic element and the proximal ends of each of the leads;
   a molded plastic carrier structure spaced apart from the package body and encapsulating at least a portion of the distal ends but not the extreme distal ends of at least some of the leads and bounded by an outer edge; and
   an exposed probe area comprising the extreme distal end of the leads, the probe area extending from the outer edge of the molded plastic carrier, angled from the plane, and substantially conforming to the outer edge of the molded carrier.

10. The packaged electronic device of claim 9 wherein the package body and the molded plastic carrier structure are formed of different materials.

11. A packaged electronic device having a carrier structure comprising:
   a lead frame including a plurality of substantially planar leads peripherally surrounding an electronic element bonding area, each of the leads having a first end near the bonding area and a second end extending away from the bonding area;
   an electronic element bonded to the first ends of the leads;
   a molded plastic body enclosing the electronic element and the first ends of the leads;
   a molded plastic carrier structure spaced apart from the package body and enclosing a portion of the leads intermediate between the first and second ends, the carrier structure having a shaped outer periphery facing away from the molded plastic body; and a probe area comprising the extremity of the second end of the leads, the probe area extending through the carrier structure, bent out of the plane of the leads, and shaped to substantially conform to the shape of the outer periphery.

12. The device of claim 11 wherein the substantially planar leads have first and second major surfaces and wherein the probe area comprises a portion of the leads bent in a direction normal to the major surfaces to place the first of the surfaces in substantial alignment with and facing the periphery of the carrier structure and exposing the second surface for test.

13. The device of claim 12 wherein the probe areas are alternately bent upward and downward relative to the plane of the substantially planar leads.

14. The device of claim 11 wherein the carrier structure comprises a top surface and a bottom surface terminating in the shaped outer periphery and wherein the probe areas extend to one of the top and bottom surfaces.

15. The device of claim 14 wherein the enclosed portion of the leads are positioned midway between the top and bottom surfaces.

16. The device of claim 11 wherein the shaped outer periphery comprises a plurality of crenels and wherein the probe areas are captured in the crenels to reduce sideways movement.

* * * * *